(12) United States Patent
Lin et al.

(10) Patent No.: US 6,346,900 B1
(45) Date of Patent: Feb. 12, 2002

(54) DRIVING CIRCUIT

(75) Inventors: Shi-Tron Lin, Taipei; Yung-Peng Hwang, HsinChu, both of (TW)

(73) Assignee: Winbond Electronics Corporation (TW)

(*) Notice: Subject to any disclaimer, the term of this patent is extended or adjusted under 35 U.S.C. 154(b) by 0 days.

(21) Appl. No.: 09/457,893

(22) Filed: Dec. 10, 1999

(51) Int. Cl.$^7$ ................................ H03M 1/66
(52) U.S. Cl. ................ 341/145; 327/333; 327/530
(58) Field of Search ...................... 341/144, 145, 341/146, 150, 122, 120, 136; 327/333, 330, 530; 307/296.1; 340/784; 345/98

(56) References Cited

U.S. PATENT DOCUMENTS

| | | | |
|---|---|---|---|
| 4,714,921 A | 12/1987 | Kanno et al. | |
| 4,845,488 A | 7/1989 | Kelly | |
| 4,955,696 A | 9/1990 | Taniguchi et al. | |
| 5,120,991 A | 6/1992 | Takahashi | |
| 5,168,270 A | 12/1992 | Masumori et al. | |
| 5,170,155 A | 12/1992 | Plus et al. | |
| 5,170,158 A | 12/1992 | Shinya | |
| 5,192,945 A | 3/1993 | Kusada | |
| 5,196,738 A | 3/1993 | Takahara et al. | |
| 5,283,565 A | 2/1994 | Suzuki et al. | |
| 5,510,748 A | * 4/1996 | Erhart et al. | 327/530 |
| 5,578,957 A | * 11/1996 | Erhart et al. | 327/333 |
| 5,754,156 A | 5/1998 | Erhart et al. | |

\* cited by examiner

Primary Examiner—Brian Young
Assistant Examiner—John Nguyen
(74) Attorney, Agent, or Firm—Finnegan, Henderson, Farabow, Garrett & Dunner, L.L.P.

(57) ABSTRACT

A driving circuit such as for driving pixels of an LCD includes first and second digital-to-analog converters respectively coupled to receive first and second digital input values. The outputs of the first and second digital-to-analog converters are connected to first and second output transistors, the outputs of which are connected together to a driving voltage output terminal. A predetermined voltage is applied to the gate of each output transistor. The first and second digital-to-analog converters and their associated output transistors correspond to upper and lower ranges of output voltage. During a display cycle, one digital-to-analog converter receives a digital value to be output as a driving voltage, while the other digital-to-analog converter receives a digital value to be output as a voltage that renders its associated output transistor nonconductive. Voltage values are selected so that the output transistors can be designed to withstand voltage values that are less than the maximum value of the full voltage range that the driving circuit can output.

64 Claims, 4 Drawing Sheets

DRIVING CIRCUIT

BACKGROUND OF THE INVENTION

1. Field of the Invention

The present invention relates generally to a driving circuit for outputting a driving voltage and, more particularly, to a driving circuit that provides a large output driving voltage range while utilizing transistors that have relatively lower voltage tolerance.

2. Description of the Related Art

A conventional liquid crystal display (LCD) comprises an array of pixels arranged in rows and columns. The image information displayed at each pixel, e.g., a shade of grey or color, is controlled by the magnitude of a driving voltage applied thereto. The LCD is typically driven by enabling one row of pixels of the display, at one time, and applying driving voltages to the respective columns of pixels. This process is repeated for each row of the display to generate a complete displayed image. The entire process is periodically repeated to updated the displayed image.

In accordance with current designs of LCDs, it is desirable to apply a driving voltage to each pixel in a relatively large voltage range, e.g., 0–12 volts. Theoretically, in order for a driving circuit constructed of MOSFETs to be capable of outputting driving voltages over such a range, the individual transistors would need to be designed to tolerate the highest output voltage, e.g., 12 volts. This would result in the transistors each being relatively physically large to provide tolerance to an output voltage that the transistors are only occasionally subjected to during operation. Also, disadvantageously, the larger size of these transistors results in the circuitry into which they are integrated to take up more physical space. Such additional physical space generally equates with additional cost and size for the LCD.

One solution to the problems created by the use of MOSFETs sized to tolerate the full range of driving voltage is to limit the range of voltage to which each individual transistor in the driving circuit is subjected. One way this has been accomplished is by limiting the voltages applied across the gate oxides of the driving transistors to be less than the gate oxide breakdown voltage. More particularly, this is achieved for each driving transistor by selecting a fixed voltage for application to its gate terminal to result in the voltage across the gate oxide being less than the gate oxide breakdown voltage. However, in order to implement this arrangement in a driving circuit with a large output voltage range, it is necessary to divide the desired driving voltage range into two portions and provide two MOSFETs respectively associated with the two portions.

In conventional practice it has also been necessary to couple desired output voltages to the individual driving circuit transistors through multiplexing circuitry. Such multiplexing circuitry increases the complexity and cost of the driving circuitry and slows down operations, to the detriment of LCD operation.

SUMMARY OF THE INVENTION

Accordingly, the present invention is directed to a driving circuit that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the method and apparatus particularly pointed out in the written description and claims hereof as well as the appended drawings.

To achieve these and other advantages and in accordance with the purpose of the invention, as embodied and broadly described, there is provided a circuit for outputting one of first and second analog voltages in first and second voltage ranges, respectively, the first voltage range being within a range from a high voltage V1 to a low voltage V2, the second voltage range being within a range from a high voltage V3 to a low voltage V4, comprising: a first digital-to-analog converter coupled to receive a first digital input signal corresponding to the first voltage range; a second digital-to-analog converter coupled to receive a second digital input signal corresponding to the second voltage range; an output terminal; a first gating circuit coupled between an analog output of the first digital-to-analog converter and the output terminal; a second gating circuit coupled between an analog output of the second digital-to-analog converter and the output terminal; wherein when the first digital input signal has a magnitude corresponding to the first voltage range and the second digital signal has a magnitude causing the output of the second digital-to-analog converter to render the second gating circuit nonconductive, the first analog voltage is output by the first digital-to-analog converter on the output terminal; and wherein when the second digital input signal has a magnitude corresponding to the second voltage and the first digital signal has a magnitude causing the output of the first digital-to-analog converter to render the first gating circuit nonconductive, the second analog voltage is output by the second digital-to-analog converter on the output terminal.

Also in accordance with the present invention, there is provided a method for generating one of first and second analog voltages in first and second voltage ranges, respectively, the first voltage range being within a range from a high voltage V1 to a low voltage V2, the second voltage range being within a range from a high voltage V3 to a low voltage V4, comprising: receiving at a first digital-to-analog converter a first digital input signal having a magnitude corresponding to the first voltage range; receiving at a second digital-to-analog converter a second digital input signal having a magnitude corresponding to the second voltage range; applying a first predetermined voltage to a first gating circuit coupled between an analog output of the first digital-to-analog converter and an output terminal; applying a second predetermined voltage to a second gating circuit coupled between an analog output of the second digital-to-analog converter and the output terminal; outputting the first analog voltage on the output terminal when the first digital input signal has a magnitude corresponding to the first voltage range and the second digital signal has a magnitude causing the output of the second digital-to-analog converter to render the second gating circuit nonconductive; and outputting the second analog voltage on the output terminal when the second digital input signal has a magnitude corresponding to the second voltage range and the first digital signal has a magnitude causing the output of the first digital-to-analog converter to render the first gating circuit nonconductive.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate

DETAILED DESCRIPTION

Figure 1:
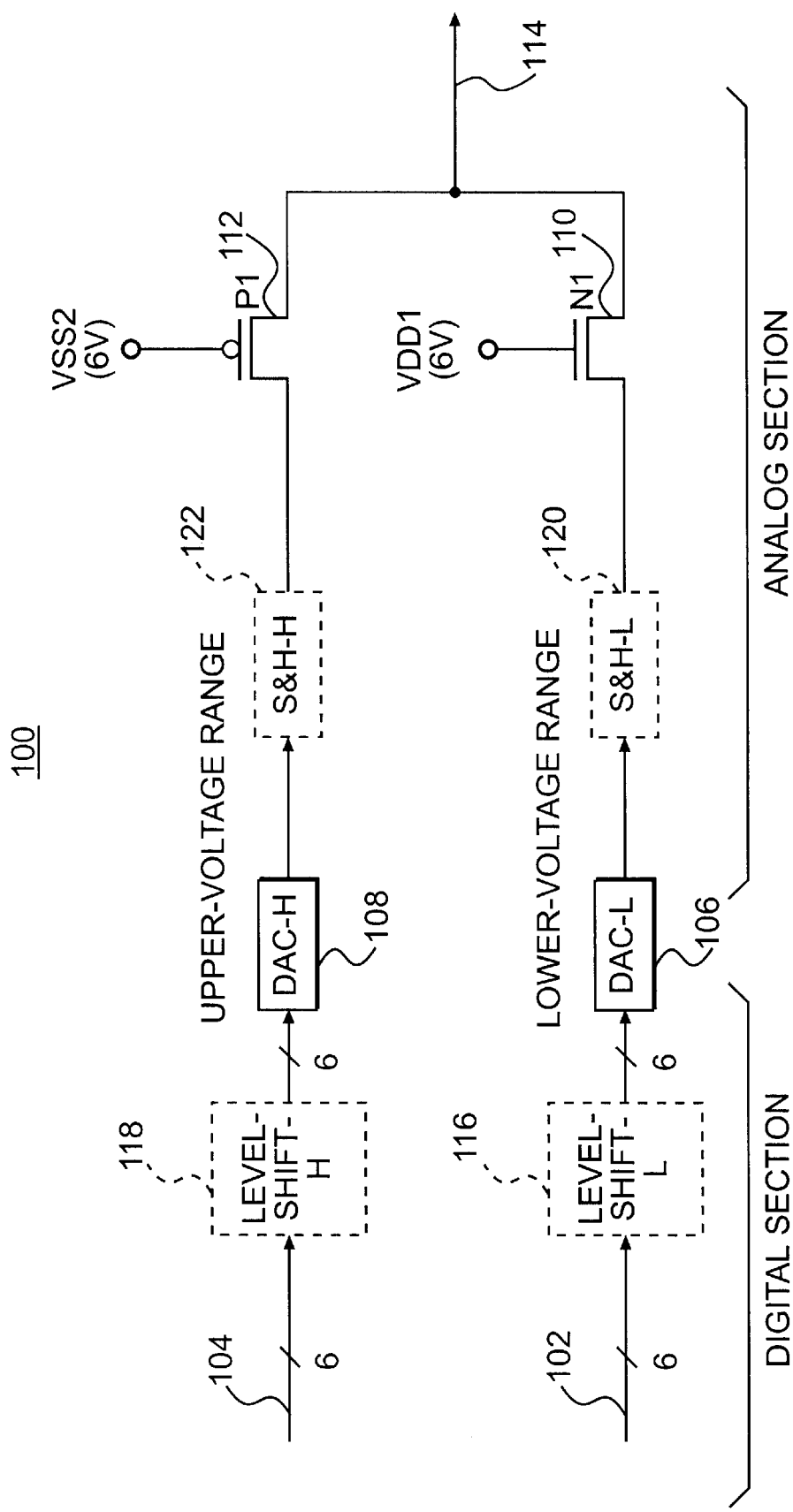
FIG. 1 illustrates a driving circuit constructed in accordance with a first embodiment of the invention.

FIG. 1 illustrates a driving circuit 100 constructed according to a first embodiment of the present invention. Circuit 100 is coupled to receive digital values representative of desired output driving voltages in a desired range, e.g., 0–12 volts. Driving circuit 100 may, for example, be used for outputting driving voltages for driving pixels of an LCD. The range of output driving voltages is divided into upper and lower voltage ranges which preferably are the upper and lower halves of the voltage range, although the range need not be evenly divided. Further, the output voltage provided can be in ranges within these ranges. In the present example, the lower range is 0 to 6 volts, designated herein as VSS1 to VDD1, respectively, and the upper range is 6 to 12 volts, designated here as VSS2 to VDD2, respectively. Thus in the present example, voltages VSS1, VDD1, VSS2, and VDD2 are provided to be related as approximately y volts, (x+y) volts, (x+y) volts, and (2x+y) volts, respectively, where y can be 0, or a positive or negative value, and x can be a positive or negative value. Circuit 100 is coupled to receive on an input 102 a first digital input value that corresponds to a driving voltage in the lower voltage range. Similarly, circuit 100 is coupled to receive on an input 104 a second digital input value that corresponds to a driving voltage in the upper voltage range. The digital input values can be generated by the video control circuitry controlling operation of the LCD. As shown in FIG. 1, the digital input values may each consist of 6-bit data.

The digital value on input 102 is applied to a digital-to-analog converter (DAC) 106 for converting to analog values the digital input values in the lower voltage range. Similarly, the digital input on input 104 is applied to a DAC 108 for converting to analog values the digital input values in the upper voltage range. The analog outputs of DACs 106 and 108 are respectively applied to gating circuits provided as driving transistors 110 and 112. The outputs of transistors 110 and 112 are coupled to an output terminal 114.

Circuit 100 can optionally include a level shift circuit 116 coupled between input 102 and DAC 106 and a level shift circuit 118 coupled between input 104 and DAC 108. Level shift circuits 116 and 118 would be included in driving circuits in which it is desirable to shift the digital input values to different voltage ranges. For example, level shifting may be practiced to shift the input digital value to a voltage within a range for which the DAC is rated.

Circuit 100 can also optionally include a sample and hold circuit 120 coupled between DAC 106 and transistor 110 and a sample and hold circuit 122 coupled between DAC 108 and transistor 112. Sample and hold circuits 120 and 122 can be included in driving circuits if it is desirable to hold the analog output values of DACs 106 and 108, respectively.

Transistors 110 and 112 are preferably provided as MOSFETs. Transistors 110 and 112 are further preferably provided as an n-channel MOSFET (NMOS) and a p-channel MOSFET (PMOS), respectively, and further preferably provided as a CMOS pair, i.e., one transistor having a conductivity type opposite the other. The gate terminals of transistors 110 and 112 are respectively coupled to receive predetermined voltages VDD1 and VSS2. In the present example, VDD1=VSS2=6 volts. However, these voltages need not be equal, so that in a variation of the present example, these two voltages could be different, e.g., respectively provided as 6.2 and 5.8 volts, or vice versa.

The voltages applied to the gates and inputs of transistors 110 and 112 are selected so that the voltage across the gate oxide of either transistor never exceeds a voltage withstand capability, which is 6 volts in the present example. More particularly, transistor 110 is coupled to receive the analog output value from DAC 106 which is in the low voltage range of 0–6 volts for conducting to output terminal 114, and transistor 112 is coupled to receive the analog output value from DAC 108 which is in the high voltage range of 6–12 volts for conducting to output terminal 114. Further, when one of transistors 110 and 112 receives a voltage to conduct to output terminal 114, the other transistor receives from its associated DAC a non-passing voltage that renders it non-conductive. Since the voltage on output terminal 114 can range within 0–12 volts, the 6 volt withstand capabilities of transistors 110 and 112 are not exceeded.

In operation, the first and second digital input values applied to input terminals 102 and 104 of circuit 100 are selected so that one of transistors 110 and 112 conducts the corresponding analog voltage and the other of transistors 110 and 112 is rendered non-conductive. For example, if it is desired to output a driving voltage, e.g., 9.5 volts, in the upper voltage range, the digital value corresponding to that desired input voltage is applied to input terminal 104. DAC 108 outputs in analog form the desired output voltage for application to transistor 112. Transistor 112 outputs the desired voltage on output terminal 114. At the same time, a digital value corresponding to an analog voltage that will not be conducted by transistor 110, i.e., a non-passing voltage, is applied to input 102. DAC 106 outputs in analog form the non-passing voltage. With the threshold voltage of transistor 110 designated VT1, as long as the non-passing voltage is in a range between VDD1−VT1 and VDD1 or, more generally, is VDD1−VT1 or greater and if the output voltage present on output terminal 114 is above VDD1−VT1, transistor 110 will be non-conductive. Thus, in the present example, if transistor 110 has a threshold value of 0.8 volts and VDD1=6 volts, then as long as the non-passing voltage is in the range of 5.2 volts and 6 volts or higher than 6 volts, and the voltage present on output terminal 114 is above 5.2 volts, transistor 110 will be non-conductive. More particularly, since the source and drain potential of NMOS transistor 110 are both higher than VDD1−VT1, the transistor is naturally turned off without any analog switching.

As a further example, if it is desired to output a driving voltage, e.g., 2.5 volts, in the lower voltage range, the digital value corresponding to that desired voltage is applied to input terminal 102. DAC 106 outputs in analog form the desired output voltage for application to transistor 110 and transistor 110 outputs the desired voltage on output terminal 114. At the same time, a digital value corresponding to a non-passing voltage that will not be conducted by transistor 112 is applied to input 104. DAC 108 outputs in analog form the non-passing voltage. With the threshold voltage of transistor 112 designated VT2, as long as the non-passing voltage is in a range between VSS2+|VT2| and VSS2 or, more generally, is VSS2+|VT2| or less, and if the output voltage present on output terminal 114 is below VSS2+ |VT2|, transistor 112 will be non-conductive. Thus in the present example, if transistor 112 has a threshold voltage of −0.9 volts, and VSS2=6 volts, then as long as the non-passing voltage is in the range of 6.9 volts and 6 volts or lower than 6 volts, and the voltage present on output terminal 114 is below 6.9 volts, transistor 112 will be non-conductive. More particularly, since the source and drain potentials of PMOS transistor 112 are both less than VSS2+|VT2|, the transistor is naturally turned off without any analog switching.

With respect to the non-passing voltages generated by DACs 106 and 108, each of these DACs can be constructed to provide the desired analog non-passing voltage in response to a predetermined digital input value. For example, in the case of 6-bit digital data, each of DACs 106 and 108 can be constructed to output a non-passing voltage in response to the digital input value "111111" corresponding to the decimal value 64.

Preferably, the non-passing voltage is generated slightly earlier than the voltage that will be conducted. So, for example, the digital value corresponding to the non-passing voltage can be applied slightly earlier to the appropriate circuit input, e.g., input 102 or 104.

In the described operation of circuit 100, the gate oxide of each of transistors 110 and 112 is subjected to no more than 6 volts gate-to-source or gate-to-drain. Thus, each of transistors 110 and 112 can be constructed to withstand 6 volts while being implemented in a driving circuit having an output voltage range of 0–12 volts. Further, since circuit 100 does not include any kind of output control circuit or multiplexer for selecting between the respective analog outputs of DACs 110 and 112, the desired analog output is conducted without delay to output terminal 114. As a result, the operating speed of circuit 100 is faster than that of conventional driving circuits. Further, in view of the lower withstand voltage and absence of output control or multiplexer circuit, the driving circuit requires less space and thus promotes more compact circuitry and reduced cost.

While voltage ranges of 0 to 6 volts and 6 to 12 volts have been illustrated, driving circuit 100 can be constructed for different voltage ranges. For example, circuit 100 can be constructed to provide an output voltage range of 0 to 10 volts. In such an implementation, the lower and upper voltage ranges could be, for example, 0 to 5 volts and 5 to 10 volts, respectively. Further, voltage VDD1 applied to the gate of NMOS transistor 110 would be 6 volts and the non-passing voltage for application to transistor 110 would be 6 volts. The voltage VSS2 applied to the gate of PMOS transistor 112 would be 4 volts and the non-passing voltage for application to transistor 112 would be 4 volts. The threshold voltages VT1 and |VT2| would be about 1 volt. More generally, with respect to selecting transistors for constructing circuit 100, the threshold voltage of each transistor depends on the source voltage when the transistor is conducting.

Figure 2:
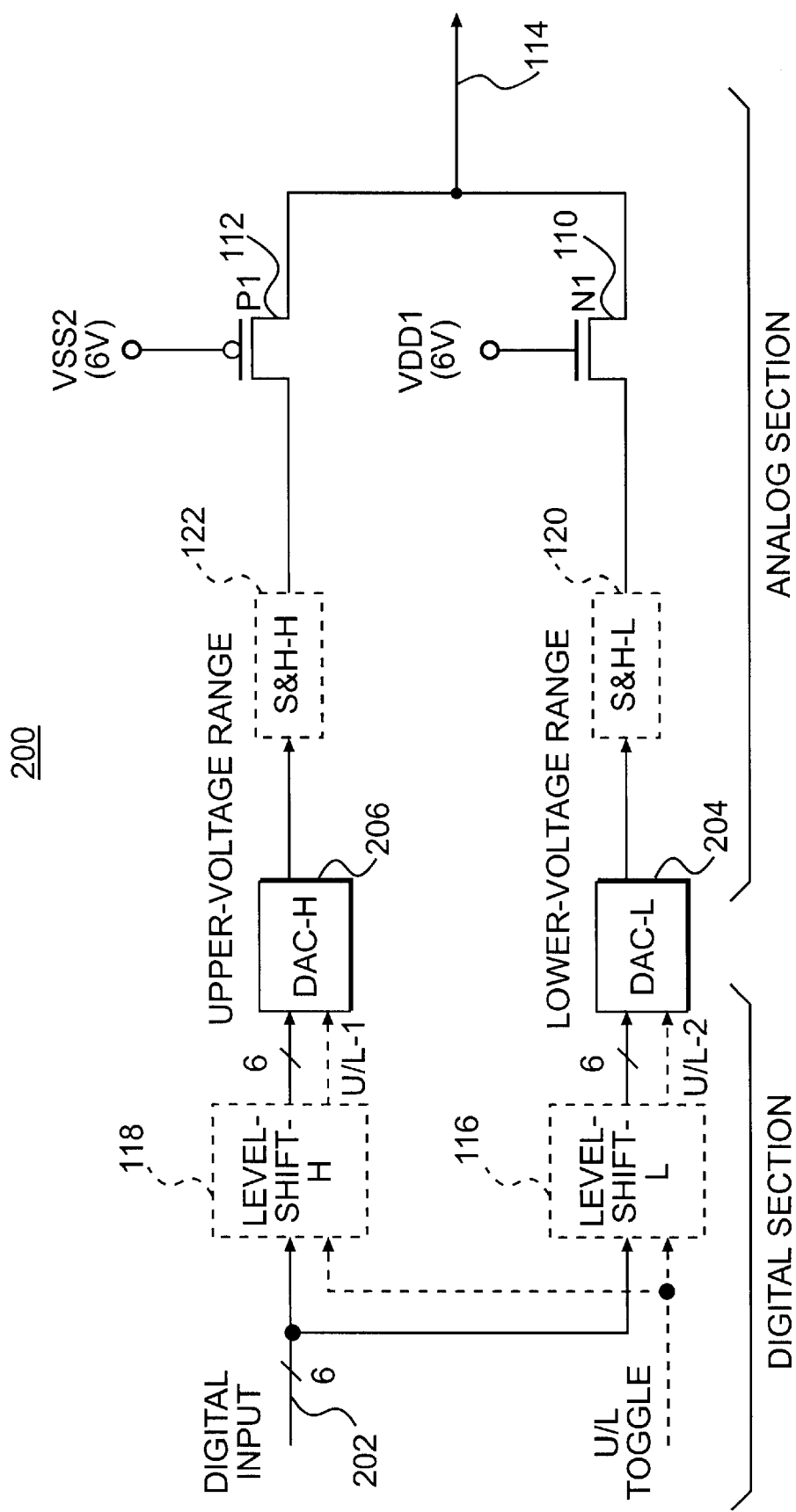
FIG. 2 illustrates a driving circuit constructed in accordance with a second embodiment of the present invention.

FIG. 2 illustrates a driving circuit 200 constructed in accordance with a second embodiment of the present invention. Circuit 200 has features in common with circuit 100, which are identified by the same reference numerals. Circuit 200 differs from circuit 100 in that circuit 200 is adapted to receive on an input 202 only a single digital input value representative of the desired output driving voltage in the desired voltage range, e.g, 0–12 volts. Circuit 200 is also adapted to receive a binary upper/lower (U/L) voltage range selecting toggle signal. The digital input value and U/L toggle signal are applied to DACs 204 and 206 respectively associated with the lower and upper voltage ranges. DAC 204 is constructed to convert to analog form the applied digital input value when the toggle signal has a first value and to output a non-passing voltage to transistor 110 when the toggle signal has a second, complementary value. Similarly, DAC 206 is constructed to convert to analog form the applied digital input value when the toggle signal has the second value and to output a non-passing voltage to transistor 112 when the toggle signal has the first value. Thus, when the digital input value is generated, the toggle signal is also generated to have the second value if the digital input value corresponds to the upper voltage range, and to have the first value when the digital input signal corresponds to the lower voltage range. Thus, the toggle signal is set to the first or second value depending on whether the output voltage needs to be in the upper or lower voltage range at that time. In order to be responsive to the toggle signal values, each of DAC's 204 and 206 includes logic that shunts the analog voltage generation circuitry and provides a fixed non-passing voltage output when the toggle signal requires generation of a non-passing voltage.

As shown in FIG. 2, if optional level shifters 116 and 118 are provided, they can shift the value of the toggle signal to an appropriate voltage range if required for proper operation of DACs 204 and 206.

Figure 3:
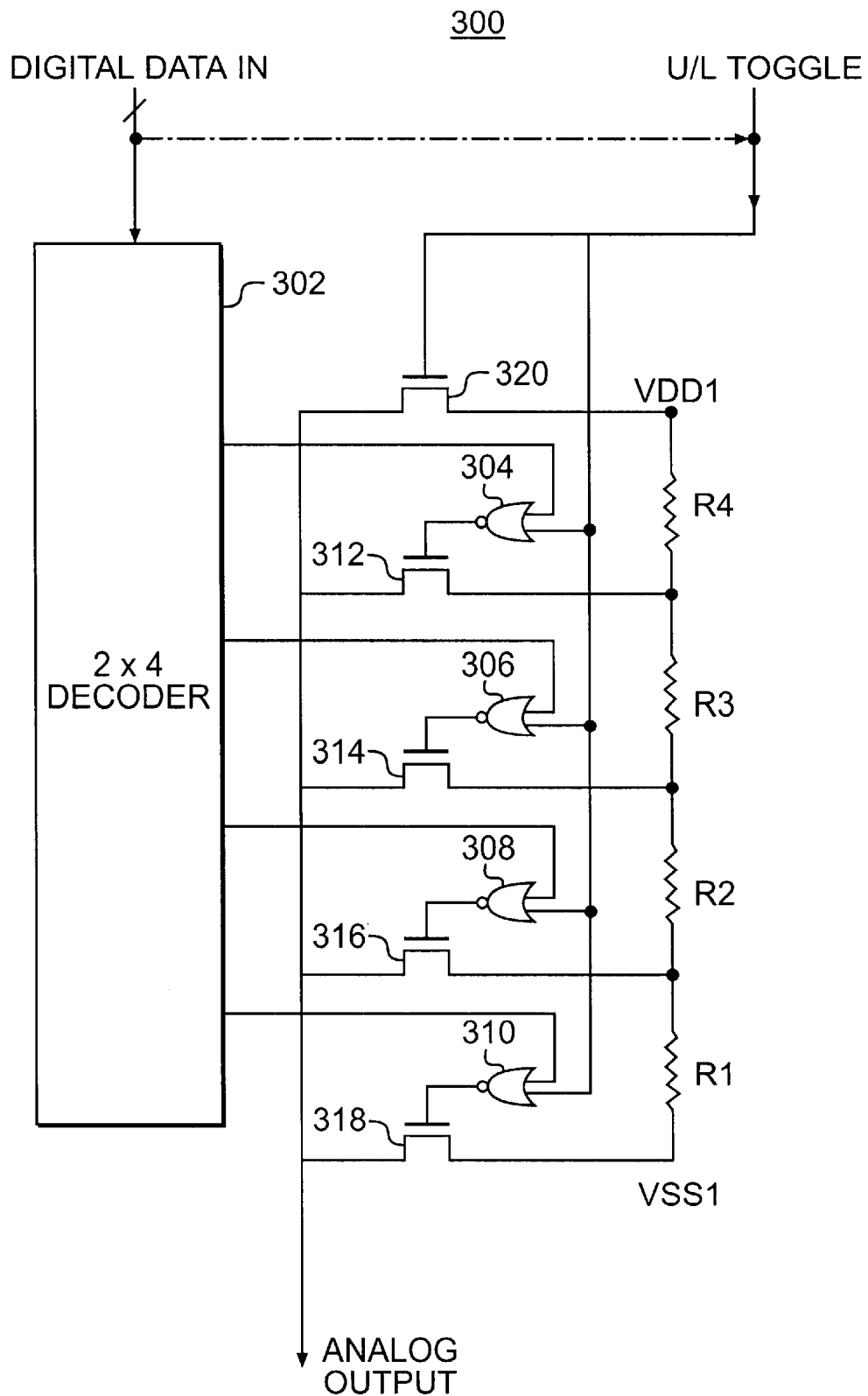
FIG. 3 illustrates a digital-to-analog converter suitable for use in the driving circuit illustrated in FIG. 2.

An example of a suitable DAC circuit 300 is illustrated in FIG. 3. DAC 300 is illustrated for the voltage range corresponding to DAC 204, but a person of ordinary skill would now appreciate how its structure can be modified for the voltage range corresponding to DAC 206. To simplify explanation, DAC 300 is illustrated with a construction for processing an inputted two-bit digital value that is decoded into a four-bit value by a decoder 302. The four decoded bits are respectively applied to first inputs of NOR gates 304, 306, 308, and 310 having outputs respectively connected to the gates of NMOS transistors 312, 314, 316, and 318. The second input of each of NOR gates 304–310 is coupled to receive the U/L toggle signal. DAC 300 also includes a shunting transistor 320 coupled between supply voltage VDD1 and the analog output of DAC 300 and coupled to receive the U/L toggle signal on its gate terminal. As diagrammatically shown in FIG. 3, the U/L toggle signal can be provided as one bit, e.g., the most significant bit of the inputted digital value, with that bit applied as the toggle signal instead of to decoder 302. Resistors R1–R4 are connected in series between supply voltages VDD1 and VSS1. Each of transistors 312–318 is coupled between the analog output and a different point along the series connected resistors.

In the operation of DAC 300, if the U/L toggle signal has a logic value "1," the NOR gates 304–310 each have a logic value "0" output and each of transistors 312–318 is thereby rendered nonconductive. However, transistor 320 is rendered conductive by the logic value "1" coupled to its gate so that DAC 300 outputs voltage VDD1 as its analog output. Since the voltage VDD1 serves as a non-pass voltage for transistor 110, application of the toggle signal with logic value "1" causes the DAC to generate the non-passing voltage. If the U/L toggle signal has a logic value "0," the outputs of NOR gates 304–310 are determined by the four decoded bits which selectively cause one of the NOR gates to output the logic value "1" to turn on its associated transistor and connect a voltage along the series connected resistors to the analog output. As a result, an analog voltage corresponding to the digital input value is provided on the analog output. Further, when the U/L toggle signal is "0,"

transistor 320 is rendered non-conductive, so that the analog output is not forced to the non-pass voltage.

The present invention can be practiced with various types of DACs. For example, it can be practiced with a regular DAC that converts digital data to an analog voltage. Alternatively, it can be practiced with a DAC that has an op-amp or sample and hold circuit at the output stage. Further, it can be practiced with DACs that allow a floating output state. A floating output can also be regarded as a non-passing voltage. For example, in FIG. 3, transistor 320 can be removed and a floating output state that constitutes a non-passing state is generated at the DAC output when the U/L toggle signal is "1".

In the operation of driving circuit 200, the digital input value and U/L toggle signal are both applied to DACs 204 and 206. In response, one of the DACs outputs in analog form, the desired output voltage and the other DAC outputs a non-passing voltage. Output transistors 110 and 112 receive these DAC outputs so that one output transistor conducts the desired output voltage to output terminal 114 and the other output transistor is nonconductive. Thus, circuit 200 achieves the same advantageous results as described above for circuit 100. Further, since the U/L toggle signal is preferably generated within operating clock cycles, along with the digital input value, its generation and use do not slow down operation of driving circuit 200.

Figure 4:
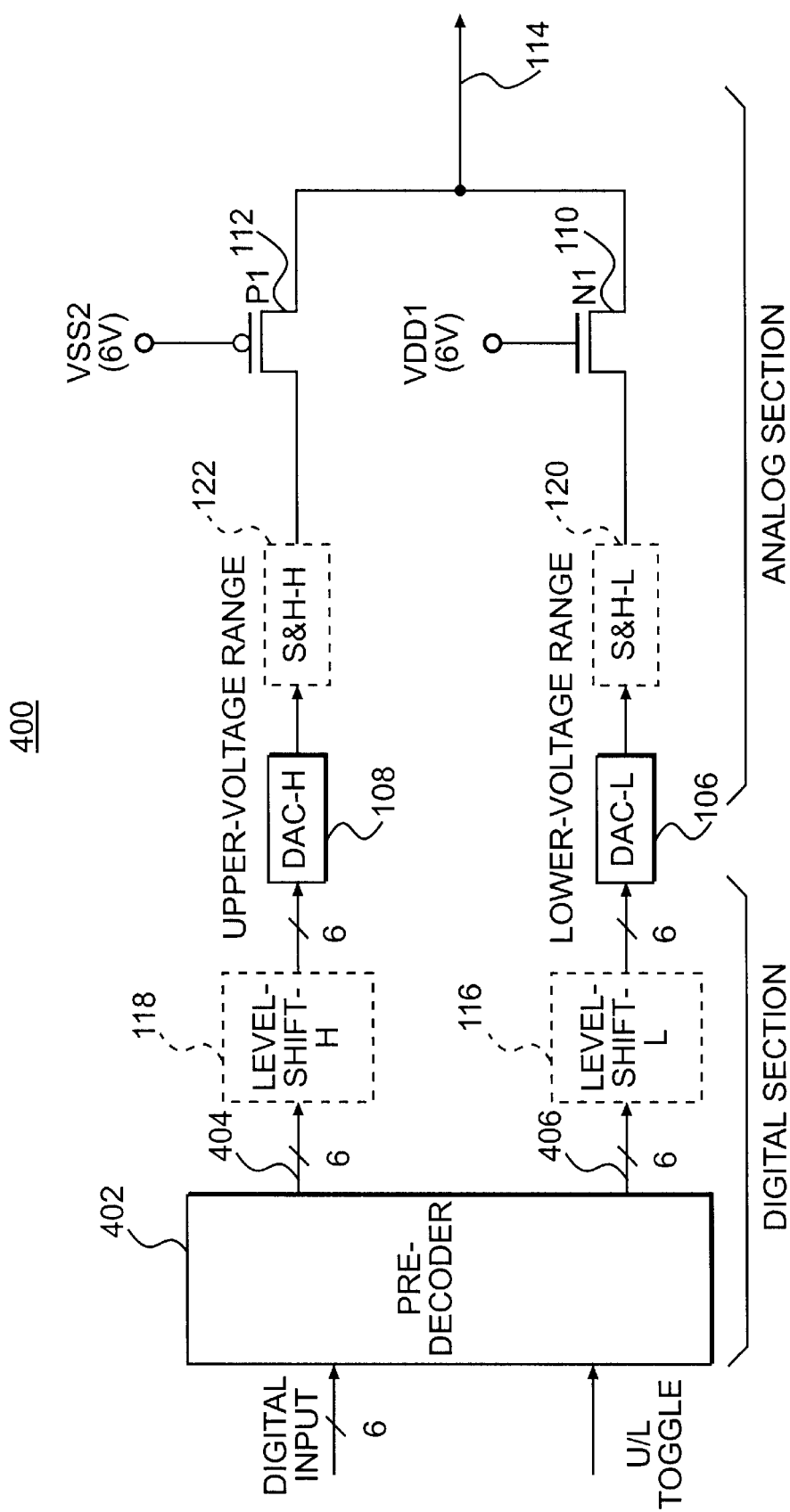
FIG. 4 illustrates a driving circuit constructed in accordance with a third embodiment of the invention.

FIG. 4 illustrates a driving circuit 400 constructed in accordance with a third embodiment of the present invention. Circuit 400 has features common with circuit 100 which are identified by the same reference numerals. Circuit 400 differs from circuit 100 in that circuit 400 further includes a predecoder 402 coupled to receive the digital input signal and the U/L toggle signal. As previously explained, the value of the U/L toggle signal selects whether the digital value to be output is in the upper or lower voltage range and thereby indicates which driving transistor should be conductive and which should be non-conductive. Predecoder 402 includes logic causing it to provide one of its digital outputs 404 and 406 to be the same as the input logic value and the other of its digital outputs to have a value corresponding to the non-pass voltage. For example, if the U/L toggle signal is "1", then pre-decoder output 404 equals the digital input, and the other pre-decoder output 406 corresponds to a non-passing analog voltage at the DAC 106 output. If the U/L toggle signal is "0", then the opposite result is provided. Thus, the outputs of predecoder 402 functionally correspond to the digital input of driving circuit 100 in FIG. 1. Thus provision of predecoder 402 is one way to provide the inputs to circuit 100 in FIG. 1.

In the operation of driving circuit 400, the digital input value corresponding to the desired voltage to be output by the driving circuit is applied to predecoder 402 along with the U/L toggle signal having a value indicating whether the output voltage is in the upper or lower range. In response, the predecoder outputs the digital value corresponding to the desired output voltage on the output connected to the DAC of the corresponding voltage range. For example, if the U/L toggle signal indicates the desired voltage is in the upper voltage range, predecoder 402 outputs the desired digital value for application to DAC 108. Further, predecoder 402 outputs a digital value corresponding to a non-pass voltage on its other output for application to DAC 106. Driving circuit 400 then operates in the same manner as described above for driving circuit 100.

While a driving circuit for driving pixels of an LCD has been disclosed, the invention is not so limited. Driving circuits consistent with the present invention can be used in other applications in which it is important to provide high operating speed and small size, in which driving voltages are initially encoded in digital form, and/or the output voltage range exceeds the voltage tolerance of circuit transistors.

While embodiments have been disclosed in which the output voltage range is divided into two ranges for two output transistors, the invention can be practiced to divide the voltage range into more than two ranges for a corresponding number of output transistors.

It will be apparent to those skilled in the art that various modifications and variations can be made in the apparatus and method of the present invention without departing from the spirit or scope of the invention. Thus, it is intended that the present invention cover the modifications and variations of this invention provided they come within the scope of the appended claims and their equivalents.

What is claimed is:

1. A circuit for outputting one of first and second analog voltages in first and second voltage ranges, respectively, the first voltage range being within a range from a high voltage V1 to a low voltage V2, the second voltage range being within a range from a high voltage V3 to a low voltage V4, comprising:
    a first digital-to-analog converter coupled to receive a first digital input signal corresponding to the first voltage range;
    a second digital-to-analog converter coupled to receive a second digital input signal corresponding to the second voltage range;
    an output terminal;
    a first gating circuit coupled between an analog output of the first digital-to-analog converter and the output terminal;
    a second gating circuit coupled between an analog output of the second digital-to-analog converter and the output terminal;
    wherein when the first digital input signal has a magnitude corresponding to the first voltage range and the second digital signal has a magnitude causing the output of the second digital-to-analog converter to render the second gating circuit nonconductive, the first analog voltage is output by the first digital-to-analog converter on the output terminal; and
    wherein when the second digital input signal has a magnitude corresponding to the second voltage and the first digital signal has a magnitude causing the output of the first digital-to-analog converter to render the first gating circuit nonconductive, the second analog voltage is output by the second digital-to-analog converter on the output terminal.

2. The circuit of claim 1, wherein the first gating circuit comprises a first MOS transistor and the second gating circuit comprises a second MOS transistor.

3. The circuit of claim 2, wherein:
    a gate of the first MOS transistor is coupled to receive a gate voltage approximately equal to the voltage V1; and
    a gate of the second MOS transistor is coupled to receive a gate voltage approximately equal to the voltage V4.

4. The circuit of claim 1, wherein voltage V3 is greater than voltage V1 and voltage V4 is greater than voltage V2.

5. The circuit of claim 1, wherein voltage V1 is substantially equal to voltage V4.

6. The circuit of claim 1, wherein voltage V2 is y volts and voltages V1, V3, and V4 are related as approximately (x+y) volts, (2x+y) volts, and (x+y) volts, respectively.

7. The circuit of claim 2, wherein the first transistor is an NMOS transistor and the second transistor is a PMOS transistor.

8. The circuit of claim 3, wherein the first MOS transistor has a first threshold voltage VT1 and is substantially nonconductive when the first digital-to-analog converter output has a magnitude in a range between V1−VT1 and V1; and wherein the second MOS transistor has a second threshold voltage VT2 and is substantially nonconductive when the second digital-to-analog converter output has a magnitude in a range between V4+|VT2| and V4.

9. The circuit of claim 3, wherein the first MOS transistor has a first threshold voltage VT1 and is substantially nonconductive when the first digital-to-analog converter output is greater than V1−VT1; and wherein the second MOS transistor has a second threshold voltage and is substantially nonconductive when the second digital-to-analog converter output is less than V4+|VT2|.

10. A circuit for outputting one of first and second analog voltages in first and second voltage ranges, respectively, the first voltage range being within a range from a high voltage V1 to a low voltage V2, the second voltage range being within a range from a high voltage V3 to a low voltage V4, comprising:

a first digital-to-analog converter coupled to receive a digital input signal having a magnitude in one of the first and second voltage ranges and a control signal;

a second digital-to-analog converter coupled to receive the digital input signal and the control signal;

an output terminal;

a first gating circuit coupled between an analog output of the first digital-to-analog converter and the output terminal, said first digital-to-analog converter being responsive to a first value of the control signal to provide an analog output that renders the first gating circuit nonconductive;

a second gating circuit coupled between an analog output of the second digital-to-analog converter and the output terminal, said second digital-to-analog converter being responsive to a second value of the control signal to provide an analog output that renders the second MOS gating circuit nonconductive;

wherein when the digital input signal has a magnitude corresponding to the first voltage range and the control signal has the second value, the first analog voltage is output by the first digital-to-analog converter on the output terminal; and wherein when the digital input signal has a magnitude corresponding to the second voltage range and the control signal has the first value, the second analog voltage is output by the second digital-to-analog converter on the output terminal.

11. The circuit of claim 10, wherein the first gating circuit comprises a first MOS transistor and the second gating circuit comprises a second MOS transistor.

12. The circuit of claim 11, wherein:

a gate of the first MOS transistor is coupled to receive a gate voltage approximately equal to the voltage V1; and a gate of the second MOS transistor is coupled to receive a gate voltage approximately equal to the voltage V4.

13. The circuit of claim 10, wherein voltage V3 is greater than voltage V1 and voltage V4 is greater than voltage V2.

14. The circuit of claim 12, wherein the first MOS transistor has a first threshold voltage VT1 and is substantially nonconductive when the first digital-to-analog converter output has a magnitude in a range between V1−VT1 and V1; and wherein the second MOS transistor has a second threshold voltage VT2 and is substantially nonconductive when the second digital-to-analog converter output has a magnitude in a range between V4+|VT2| and V4.

15. The circuit of claim 12, wherein the first MOS transistor has a first threshold voltage VT1 and is substantially nonconductive when the first digital-to-analog converter output is greater than V1−VT1; and wherein the second MOS transistor has a second threshold voltage and is substantially nonconductive when the second digital-to-analog converter output is less than V4+|VT2|.

16. The circuit of claim 11, wherein the first transistor is an NMOS transistor and the second transistor is a PMOS transistor.

17. The circuit of claim 10, wherein voltage V1 is substantially equal to voltage V4.

18. The circuit of claim 10, wherein voltage V2 is y volts and voltages V1, V3, and V4 are related as approximately (x+y) volts, (2x+y) volts, and (x+y) volts, respectively.

19. A circuit for outputting one of first and second analog voltages in first and second voltage ranges, respectively, the first voltage range being within a range from a high voltage V1 to a low voltage V2, the second voltage range being within a range from a high voltage V3 to a low voltage V4, comprising:

a decoder coupled to receive a digital input signal and a control signal indicating whether the digital input signal corresponds to the first and second voltage ranges and provide first and second digital signals;

a first digital-to-analog converter coupled to receive the first digital signal corresponding to the first voltage range;

a second digital-to-analog converter coupled to receive the second digital signal corresponding to the second voltage range;

an output terminal;

a first gating circuit coupled between an analog output of the first digital-to-analog converter and the output terminal;

a second gating circuit coupled between an analog output of the second digital-to-analog converter and the output terminal;

wherein when the control signal indicates the digital input signal corresponds to the first voltage range, the decoder outputs the digital input signal as the first digital signal and a digital value having a magnitude causing the output of the second digital-to-analog converter to render the second gating circuit nonconductive as the second digital signal; and wherein when the control signal indicates the digital input signal corresponds to the second voltage range, the decoder outputs the digital input signal as the second digital signal and a digital value having a magnitude causing the output of the first digital-to-analog converter to render the first gating nonconductive as the first digital signal.

20. The circuit of claim 19, wherein the first gating circuit comprises a first MOS transistor and the second gating circuit comprises a second MOS transistor.

21. The circuit of claim 20, wherein:

a gate of the first MOS transistor is coupled to receive a gate voltage approximately equal to the voltage V1; and a gate of the second MOS transistor is coupled to receive a gate voltage approximately equal to the voltage V4.

22. The circuit of claim 19, wherein voltage V3 is greater than voltage V1 and voltage V4 is greater than voltage V2.

23. The circuit of claim 21, wherein the first MOS transistor has a first threshold voltage VT1 and is substantially nonconductive when the first digital-to-analog converter output has a magnitude in a range between V1−VT1 and V1; and wherein the second MOS transistor has a second threshold voltage VT2 and is substantially nonconductive when the second digital-to-analog converter output has a magnitude in a range between V4+|VT2| and V4.

24. The circuit of claim 21, wherein the first MOS transistor has a first threshold voltage VT1 and is substantially nonconductive when the first digital-to-analog converter output is greater than V1−VT1; and wherein the second MOS transistor has a second threshold voltage and is substantially nonconductive when the second digital-to-analog converter output is less than V4+|VT2|.

25. The circuit of claim 20, wherein the first transistor is an NMOS transistor and the second transistor is a PMOS transistor.

26. The circuit of claim 19, wherein voltage V1 is approximately equal to voltage V4.

27. The circuit of claim 19, wherein voltage V2 is y volts and voltages V1, V3, and V4 are related as approximately (x+y) volts, (2x+y) volts, and (x+y) volts, respectively.

28. A method for generating one of first and second analog voltages in first and second voltage ranges, respectively, the first voltage range being within a range from a high voltage V1 to a low voltage V2, the second voltage range being within a range from a high voltage V3 to a low voltage V4, comprising:

receiving at a first digital-to-analog converter a first digital input signal;

receiving at a second digital-to-analog converter a second digital input signal; and outputting the first analog voltage on an output terminal when the first digital input signal has a magnitude corresponding to the first voltage range and the second digital signal has a magnitude causing the output of the second digital-to-analog converter to render nonconductive a gating circuit coupled between an analog output of the second digital-to-analog converter and the output terminal.

29. The method of claim 28 further including:

providing the first digital input signal having a magnitude corresponding to the first voltage range; and providing the second digital input signal having a magnitude corresponding to the second voltage range.

30. The method of claim 28 wherein the gating circuit is a second gating circuit;

the method further including:

applying a first predetermined voltage to a first gating circuit coupled between an analog output of the first digital-to-analog converter and an output terminal; and applying a second predetermined voltage to the second gating circuit.

31. The method of claim 30 further including:

outputting the second analog voltage on the output terminal when the second digital input signal has a magnitude corresponding to the second voltage range and the first digital signal has a magnitude causing the output of the first digital-to-analog converter to render the first gating circuit nonconductive.

32. The method of claim 31, further including:

providing the first gating circuit to include a first MOS transistor; and providing the second gating circuit to include a second MOS transistor.

33. The method of claim 32, wherein:

applying a first predetermined voltage includes applying a voltage approximately equal to the voltage V1 to a gate of the first MOS transistor; and applying a second predetermined voltage includes applying a voltage approximately equal to the voltage V4 to a gate of the second MOS transistor.

34. The method of claim 28, further including:

providing the voltage V3 to be greater than the voltage V1; and providing the voltage V4 to be greater than the voltage V2.

35. The method of claim 33, further including:

providing the first MOS transistor to have a first threshold voltage VT1 and be substantially nonconductive when the first digital-to-analog converter output has a magnitude in a range between V1−VT1 and V1; and providing the second MOS transistor to have a second threshold voltage VT2 and be substantially nonconductive when the second digital-to-analog converter output has a magnitude in a range between V4+|VT2| and V4.

36. The method of claim 33, including:

providing the first MOS transistor to have a first threshold voltage VT1 and be substantially nonconductive when the first digital-to-analog converter output is greater than V1−VT1; and providing the second MOS transistor to have a second threshold voltage VT2 and be substantially nonconductive when the second digital-to-analog converter output is less than V4+|VT2|.

37. The method of claim 32, including providing the first transistor as an NMOS transistor and the second transistor as a PMOS transistor.

38. The method of claim 28, including providing voltage V1 approximately equal to voltage V4.

39. The method of claim 28, including providing voltage V2 as y volts and voltages V1, V3, and V4 to be related as approximately (x+y) volts, (2x+y) volts, and (x+y) volts, respectively.

40. A method generating one of first and second analog voltages in first and second voltage ranges, respectively, the first voltage range being within a range from a high voltage V1 to a low voltage V2, the second voltage range being within a range from a high voltage V3 to a low voltage V4, comprising:

receiving at a first digital-to-analog converter a first digital input signal and a control signal;

receiving at a second digital-to-analog converter a second digital input signal and the control signal;

coupling a first gating circuit between an analog output of the first digital-to-analog converter and an output terminal, the first digital-to-analog converter being responsive to a first value of the control signal to provide an analog output that renders the first gating circuit nonconductive;

coupling a second gating circuit between an analog output of the second digital-to-analog converter and the output terminal, the second digital-to-analog converter being responsive to a second value of the control signal to provide an analog output that renders the second gating circuit nonconductive; and outputting a first analog voltage on the output terminal corresponding to the first digital input signal when the control signal has the second value.

41. The method of claim 40, further including:

outputting a second analog voltage on the output terminal corresponding to the second digital input signal when the control signal has the first value.

42. The method of claim 41, further including providing the first digital input signal to have a magnitude in one of the first and second voltage ranges.

43. The method of claim 42, further including providing the second digital input signal to have a magnitude in one of the first and second voltage ranges.

44. The method of claim 42, further including:

applying a first predetermined voltage to the first gating circuit; and applying a second predetermined voltage to the second gating circuit.

45. The method of claim 41, further including:

providing the first gating circuit to include a first MOS transistor; and providing the second gating circuit to include a second MOS transistor.

46. The method of claim 45, wherein:

applying a first predetermined voltage includes applying a voltage approximately equal to the voltage V1 to a gate of the first MOS transistor; and applying a second predetermined voltage includes applying a voltage approximately equal to the voltage V4 to a gate of the second MOS transistor.

47. The method of claim 40, including:

providing the voltage V3 to be greater than the voltage V1; and providing the voltage V4 to be greater than the voltage V2.

48. The method of claim 46, including:

providing the first MOS transistor to have a first threshold voltage VT1 and be substantially nonconductive when the first digital-to-analog converter output has a magnitude in a range between V1−VT1 and V1; and providing the second MOS transistor to have a second threshold voltage VT2 and be substantially nonconductive when the second digital-to-analog converter output has a magnitude in a range between V4+|VT2| and V4.

49. The method of claim 46, including:

providing the first MOS transistor to have a first threshold voltage VT1 and be substantially nonconductive when the first digital-to-analog converter output is greater than V1−VT1; and providing the second MOS transistor to have a second threshold voltage VT2 and be substantially nonconductive when the second digital-to-analog converter output is less than V4+|VT2|.

50. The method of claim 45, including providing the first transistor as an NMOS transistor and the second transistor is a PMOS transistor.

51. The method of claim 40, including providing voltage V1 as substantially equal to voltage V4.

52. The method of claim 40, including providing voltage V2 as y volts and voltages V1, V3, and V4 to be related as approximately (x+y) volts, (2x+y) volts, and (x+y) volts, respectively.

53. The method of claim 40, further including providing said first and second digital signals to have magnitudes in one of the first and second voltage ranges.

54. A method for outputting one of first and second analog voltages in first and second voltage ranges, respectively, the first voltage range being within a range from a high voltage V1 to a low voltage V2, the second voltage range being within a range from a high voltage V3 to a low voltage V4, comprising:

decoding a digital input signal and a control signal indicating whether the digital input signal corresponds to the first or second voltage ranges to provide first and second digital signals, respectively;

receiving at a first digital-to-analog converter the first digital signal;

receiving at a second digital-to-analog converter the second digital signal;

coupling a first gating circuit between an analog output of the first digital-to-analog converter and an output terminal;

coupling a second gating circuit between an analog output of the second digital-to-analog converter and the output terminal;

outputting to the first digital-to-analog converter the digital input signal as the first digital signal and outputting to the second digital-to-analog converter a digital value having a magnitude causing the output of the second digital-to-analog converter to render the second gating circuit nonconductive as the second digital signal, when the control signal is in a first state; and outputting to the second digital-to-analog converter the digital input signal as the second digital signal and outputting to the first digital-to-analog converter a digital value having a magnitude causing the output of the first digital-to-analog converter to render the first gating circuit nonconductive as the first digital signal, when the control signal is in a second state.

55. The method of claim 54, further including:

applying a first predetermined voltage to the first gating circuit; and applying a second predetermined voltage to the second gating circuit.

56. The method of claim 55, further including providing the first and second predetermined voltages to be substantially equal.

57. The method of claim 54, further including:

providing the first gating circuit to include a first MOS transistor; and providing the second gating circuit to include a second MOS transistor.

58. The method of claim 57, wherein:

applying a first predetermined voltage includes applying a voltage approximately equal to the voltage V1 to a gate of the first MOS transistor; and applying a second predetermined voltage includes applying a voltage approximately equal to the voltage V4 to a gate of the second MOS transistor.

59. The method of claim 54, including:

providing the voltage V3 to be greater than the voltage V1; and providing the voltage V4 to be greater than the voltage V2.

60. The method of claim 58, including:

providing the first MOS transistor to have a first threshold voltage VT1 and be substantially nonconductive when the first digital-to-analog converter output has a magnitude in a range between V1−VT1 and V1; and providing the second MOS transistor to have a second threshold voltage VT2 and be substantially nonconductive when the second digital-to-analog converter output has a magnitude in a range between V4+|VT2| and V4.

61. The method of claim 58, including:

providing the first MOS transistor to have a first threshold voltage VT1 and be substantially nonconductive when the first digital-to-analog converter output is greater than V1−VT1; and providing the second MOS transistor to have a second threshold voltage VT2 and be substantially nonconductive when the second digital-to-analog converter output is less than V4+|VT2|.

62. The method of claim 57, including providing the first transistor as an NMOS transistor and the second transistor as a PMOS transistor.

63. The method of claim 54, including providing voltage V1 as substantially equal to voltage V4.

64. The method of claim 54, including providing voltage V2 as y volts and voltages V1, V3, and V4 to be related as approximately (x+y) volts, (2x+y) volts, and (x+y) volts, respectively.

* * * * *